(12) United States Patent
Kurokawa

(10) Patent No.: US 9,297,842 B2
(45) Date of Patent: Mar. 29, 2016

(54) FREQUENCY DETECTION DEVICE

(75) Inventor: Fujio Kurokawa, Nagasaki (JP)

(73) Assignee: NAGASAKI UNIVERSITY, NATIONAL UNIVERSITY CORPORATION, Nagasaki-Shi, Nagasaki (JP)

( * ) Notice: Subject to any disclaimer, the term of this patent is extended or adjusted under 35 U.S.C. 154(b) by 0 days.

(21) Appl. No.: 12/863,005

(22) PCT Filed: Nov. 30, 2008

(86) PCT No.: PCT/JP2008/071742
§ 371 (c)(1),
(2), (4) Date: Oct. 10, 2011

(87) PCT Pub. No.: WO2009/090801
PCT Pub. Date: Jul. 23, 2009

(65) Prior Publication Data
US 2012/0062299 A1 Mar. 15, 2012

(30) Foreign Application Priority Data

Jan. 15, 2008 (JP) .................................. 2008-006315
Jan. 15, 2008 (JP) .................................. 2008-006316
Jan. 15, 2008 (JP) .................................. 2008-006317

(51) Int. Cl.
*G01R 23/15* (2006.01)
*H03L 7/02* (2006.01)
*H02M 3/156* (2006.01)

(52) U.S. Cl.
CPC *G01R 23/15* (2013.01); *H03L 7/02* (2013.01); *H02M 3/156* (2013.01)

(58) Field of Classification Search
CPC ...... G01R 23/00; G01R 23/005; G01R 23/02; G01R 23/15; H03L 7/02
USPC ................................. 327/39, 40, 47, 48, 49
See application file for complete search history.

(56) References Cited

U.S. PATENT DOCUMENTS 4,423,519 A * 12/1983 Bennett, Jr. ............. H04L 27/14
324/76.68

(Continued)

FOREIGN PATENT DOCUMENTS

| JP | 63-177070 A | 7/1988 |
| JP | 63-281062 A | 11/1988 |
| JP | 2-141029 | 5/1990 |
| JP | 04-048271 A | 2/1992 |

(Continued)

OTHER PUBLICATIONS

Shohei Sukita, Fujio Kurokawa, "Improvement of Dynamic Characteristics of Model Control DC-DC Coverter", IEICE Technical Report, Jul. 19, 2007, vol. 107, No. 149, pp. 1 to 4.

*Primary Examiner* — William Hernandez
(74) *Attorney, Agent, or Firm* — Kile Park Reed & Houtteman PLLC

(57) ABSTRACT

Disclosed are a device and a method for comparing a detected frequency signal (first frequency signal) and a second frequency signal which is obtained by delaying the detected frequency, to determine whether the frequency transitioned to a predetermined area on high frequency side or reached a predetermined value on the upward direction side. The frequency detection device (1) comprises: a delayed signal output circuit (11) that outputs a second frequency signal (F2) obtained by delaying the first frequency signal (F1), which has a frequency that changes over time, by a set period (Δi); and a determination circuit (12), which inputs the first frequency signal (F1) and the second frequency signal (F2), determines whether or not the cycle of the first frequency signal (F1) is included in the cycle of the second frequency signal (F2) and/or whether or not the cycle of the second frequency signal (F2) is included in the cycle of the first frequency signal (F1), and outputs a determination signal.

2 Claims, 4 Drawing Sheets

(56) References Cited

U.S. PATENT DOCUMENTS

| | | | | |
|---|---|---|---|---|
| 4,851,785 A | * | 7/1989 | Gehrt | H04N 5/94 327/49 |
| 5,519,389 A | * | 5/1996 | DeGunther | H04L 7/0066 250/214 R |
| 5,568,305 A | * | 10/1996 | Naito | H03D 3/22 329/315 |
| 6,011,412 A | * | 1/2000 | Byrn | H03D 13/004 327/12 |

FOREIGN PATENT DOCUMENTS

| | | |
|---|---|---|
| JP | 07-154435 A | 6/1995 |
| JP | 2000-214193 A | 8/2000 |
| JP | 2002-330545 A | 11/2002 |
| JP | 2003-332897 A | 11/2003 |
| JP | 2003-344463 A | 12/2003 |
| WO | 2007/125670 A1 | 11/2007 |

\* cited by examiner (A)

(B)

(C)

(A)

(B)

(C)

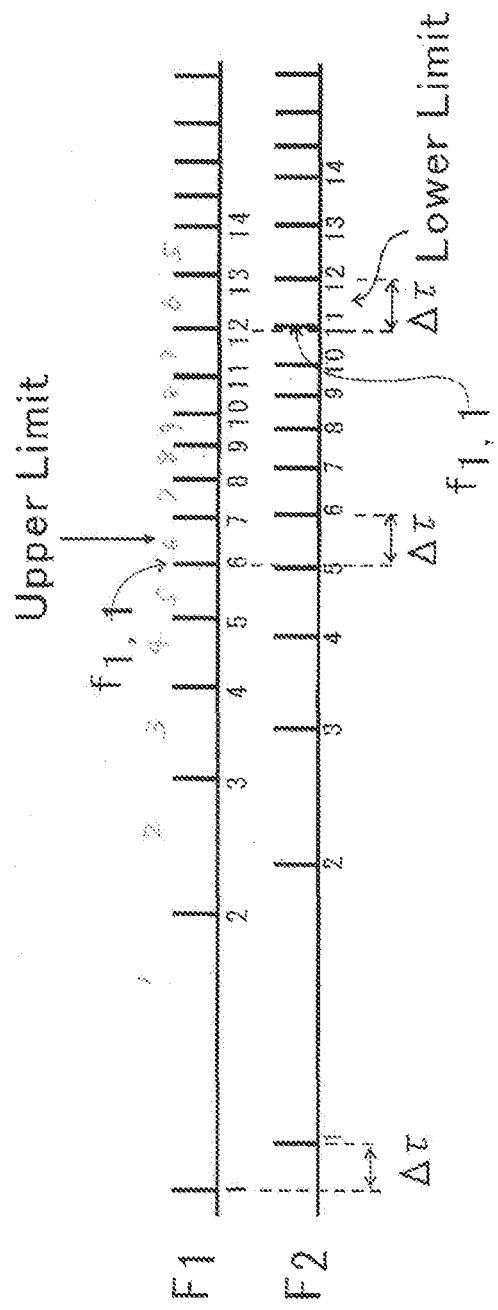

FREQUENCY DETECTION DEVICE

The present invention relates to technique to detect the frequency of a measuring periodic signal.

BACKGROUND ART

Arts to detect that the measuring signal reached a reference frequency are known conventionally. In these arts, at first a reference signal is generated, and then the phase of the reference signal and the phase of the measuring signal are compared. In this kind of the art, Recursive Discrete Fourier Transform may be used (patent document 1), or AFC (Automatic Frequency Control) loop may be used (patent document 2).

ADVANCED TECHNOLOGY LITERATURE

Patent Document

[patent document 1] JP2003-344463
[patent document 2] JP1995-154435

DISCLOSURE OF THE INVENTION

Problem to be Solved by the Invention

In each conventional art, a reference signal generator and a phase detector are necessary. Thus, there is problem that circuits are complicated.

Object of the current invention is to offer a frequency detecting apparatus using simple circuits Means for Solving Problem (1) A frequency detection apparatus of a periodic signal comprising a delayed signals output circuit and a judgement circuit, wherein the periodic signal is a string of pulses and the time interval of pulses changes according to time, the delayed signals output circuit inputs the periodic signal and outputs a second periodic signal which is delayed to the periodic signal by a predetermined delay time, the judgement circuit inputs the periodic signal and the second periodic signal, and outputs a judgement signal, in the case when the time interval of pulses decreases according to time, the judgement circuit outputs the judgement signal when two consecutive pulses of the periodic signal are located between two consecutive pulses of the second periodic signal, in the case when the time interval of pulses increases according to time, the judgement circuit outputs the judgement signal when two consecutive pulses of the second periodic signal are located between two consecutive pulses of the periodic signal.

(2) The frequency detection apparatus according to (1), wherein the delayed signals output circuit inputs the periodic signal and outputs the second periodic signal which is delayed to the periodic signal by $\Delta\tau$, in the case when the time interval of pulses decreases according to time, the judgement circuit outputs the judgement signal that the periodic signal has reached the upper limit frequency $1/\Delta\tau$ when two consecutive pulses of the periodic signal are located between two consecutive pulses of the second periodic signal, in the case when the time interval of pulses increases according to time, the judgement circuit outputs the judgement signal that the periodic signal has reached the lower limit frequency $1/\Delta\tau$ when two consecutive pulses of the second periodic signal are located between two consecutive pulses of the periodic signal.

An Effect of the Invention

By the present invention, a frequency of the measuring periodic signal is detected by using simple circuits, like a delay circuit and a judgement circuit.

BRIEF DESCRIPTION OF DRAWINGS

FIG. 4 is a diagram showing pulse string of the periodic signal and a second periodic signal.

EXPLANATIONS OF THE LETTERS OF NUMBERS 11, 12, 13 frequency detection apparatus
111, 121, 131 delayed signals output circuit
112, 122, 132 judgement circuit

THE BEST MODE FOR CARRYING OUT THE INVENTION

Embodiments of a frequency detection apparatus of the present invention are described below.

Figure 1:
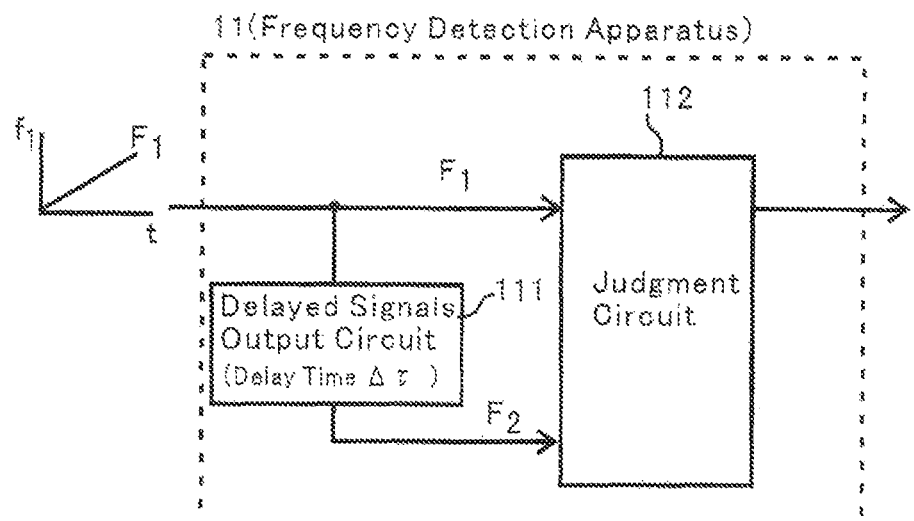
FIG. 1 shows a first embodiment of the present invention: (A) is a diagram showing a configuration of a frequency detection apparatus, (B) is a diagram showing time characteristic of a periodic signal, (C) is a diagram showing pulse string of the periodic signal and a second periodic signal.
Figure 1:
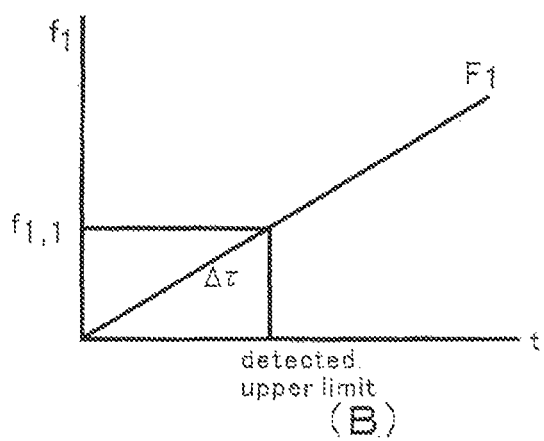
Figure 1:
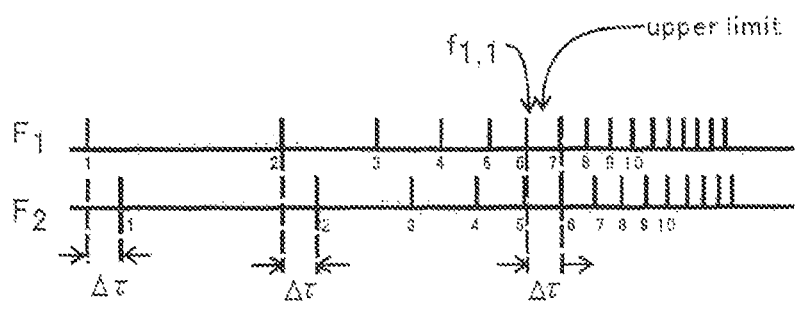

FIG. 1 is a diagram showing the first embodiment of the present invention. In FIG. 1(A), a frequency detection apparatus 11 comprises a delayed signals output circuit 111 and a judgment circuit 112. The delayed signals output circuit 111 inputs a periodic signal F1 and outputs a second periodic signal F2 which is delayed to the periodic signal F1 by $\Delta\tau$. The judgment circuit 112 inputs the periodic signal F1 and the second periodic signal F2.

The frequency of the periodic signal F1 increases in proportion to time as shown in FIG. 1 (B).

The periodic signal F1 and the second periodic signal F2 is a string of pulses as shown in FIG. 1 (C). Number (1, 2, 3, ...) is assigned to each pulse of F1 and F2 respectively. The time interval of pulse of the periodic signal F1 and the second periodic signal F2 decreases by a harmonic sequence according to time.

T1: the time interval between the 1st pulse and the 2nd pulse
T1=1 sec,
T2: the time interval between the 2nd pulse and the 3rd pulse
T2=½ sec,
T3: the time interval between the 3rd pulse and the 4th pulse
T3=⅓ sec,
. . .
Delay time $\Delta\tau$ is set as follows:

$\Delta\tau <= T1$

The judgment circuit 112 detects the pulses as follows:
"the 1st pulse of F1",
"the 1st pulse of F2",
"the 2nd pulse of F1",
"the 2nd pulse of F2",
"the 3rd pulse of F1",
"the 3rd pulse of F2",
"the 4th pulse of F1",
"the 4th pulse of F2",
"the 5th pulse of F1",
"the 5th pulse of F2",
"the 6th pulse of F1", and
"the 7th pulse of F1".

Alternating characteristics is lost at this time. The 6th pulse and the 7th pulse of the periodic signal F1 are both located between the 5th pulse and the 6th pulse of the second periodic signal F2. That is, the time interval of pulse of the periodic signal F1 has changed from longer than $\Delta\tau$ to shorter than $\Delta\tau$.

The frequency (f1, 1) is $1/\Delta\tau$ and the upper limit frequency to be detected. The judgment circuit 112 outputs a judgment signal that the periodic signal F1 has reached the upper limit frequency at this time.

The frequency of the periodic signal F1 increases as "1 Hz, 2 Hz, 3 Hz, ..." in FIGS. 1(B) and (C).

However, the frequency of the periodic signal F1 may increase as "$25*10^6$ Hz, $(25*10^6+1)$Hz, $(25*10^6+2)$Hz, ...", or as "$25*10^6$ Hz, $(25*10^6+10)$Hz, $(25*10^6+20)$Hz, ...".

Figure 2:
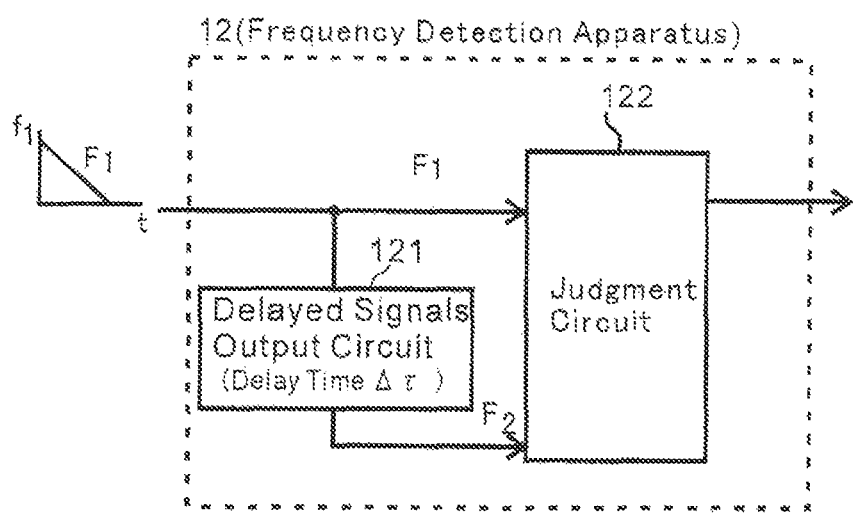
FIG. 2 shows a second embodiment of the present invention, where (A) is a diagram showing a configuration of a frequency detection apparatus, (B) is a diagram showing time characteristic of a periodic signal, and (C) is a diagram showing pulse string of the periodic signal and a second periodic signal.
Figure 2:
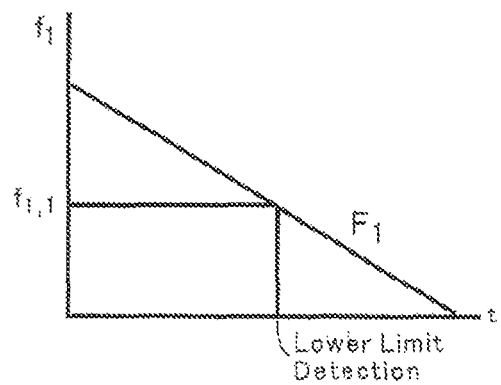
Figure 2:
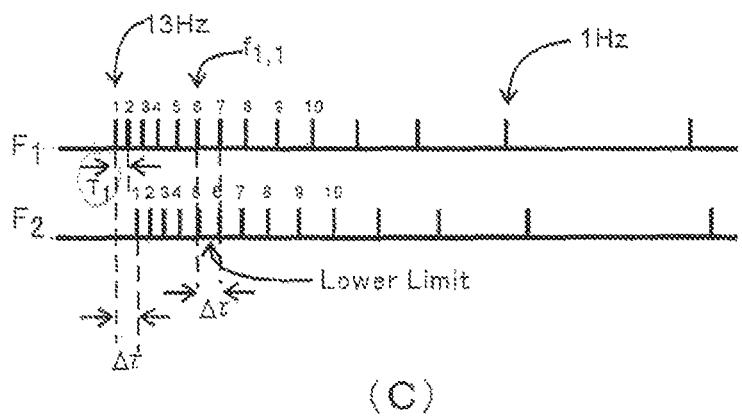

FIG. 2 is a diagram showing the second embodiment of the present invention. In FIG. 2(A), a frequency detection apparatus 12 comprises a delayed signals output circuit 121 and a judgment circuit 122. The delayed signals output circuit 121 inputs a periodic signal F1 and outputs a second periodic signal F2 which is delayed to the periodic signal F1 by $\Delta\tau$. The judgment circuit 122 inputs the periodic signal F1 and the second periodic signal F2.

The frequency of the periodic signal F1 decreases in proportion to time as shown in FIG. 2(B).

The periodic signal F1 and the second periodic signal F2 is a string of pulses as shown in FIG. 2(C). Number (1, 2, 3, ...) is assigned to each pulse of F1 and F2 respectively. The time interval of pulse of the periodic signal F1 and the second periodic signal F2 increases by a harmonic sequence according to time.

T1: the time interval between the 1st pulse and the 2nd pulse
T1=1/13 sec,
T2: the time interval between the 2nd pulse and the 3rd pulse
T2=1/12 sec,
T3: the time interval between the 3rd pulse and the 4th pulse
T3=1/11 sec,
...
Delay time $\Delta\tau$ is set as follows:

$$T1 < \Delta\tau <= (T1+T2)$$

The judgment circuit 122 detects the pulses as follows:
"the 1st pulse of F1"
"the 2nd pulse of F1",
"the 1st pulse of F2",
"the 3rd pulse of F1",
"the 2nd pulse of F2",
"the 4th pulse of F1",
"the 3rd pulse of F2",
"the 5th pulse of F1",
"the 4th pulse of F2",
"the 6th pulse of F1",
"the 5th pulse of F2", and
"the 6th pulse of F2".

Alternating characteristics is lost at this time except at the beginning of detection. The 5th pulse and the 6th pulse of the second periodic signal F2 are both located between the 6th pulse and the 7th pulse of the periodic signal F1. That is, the time interval of the periodic signal F1 has changed from shorter than $\Delta\tau$ to longer than $\Delta\tau$. The frequency (f1, 1) is $1/\Delta\tau$ and the lower limit frequency to be detected. The judgment circuit 122 outputs a judgment signal that the periodic signal F1 has reached the lower limit frequency at this time.

The frequency of the periodic signal F1 decreases as "13 Hz, 12 Hz, 11 Hz, ..." in FIGS. 2 (B) and (C). However, the frequency of the periodic signal F1 may decrease as "$25*10^6$ Hz, $(25*10^6-1)$Hz, $(25*10^6-2)$Hz, ...", or as "$25*10^6$ Hz, $(25*10^6-10)$Hz, $(25*10^6-20)$Hz, ...".

Figure 3:
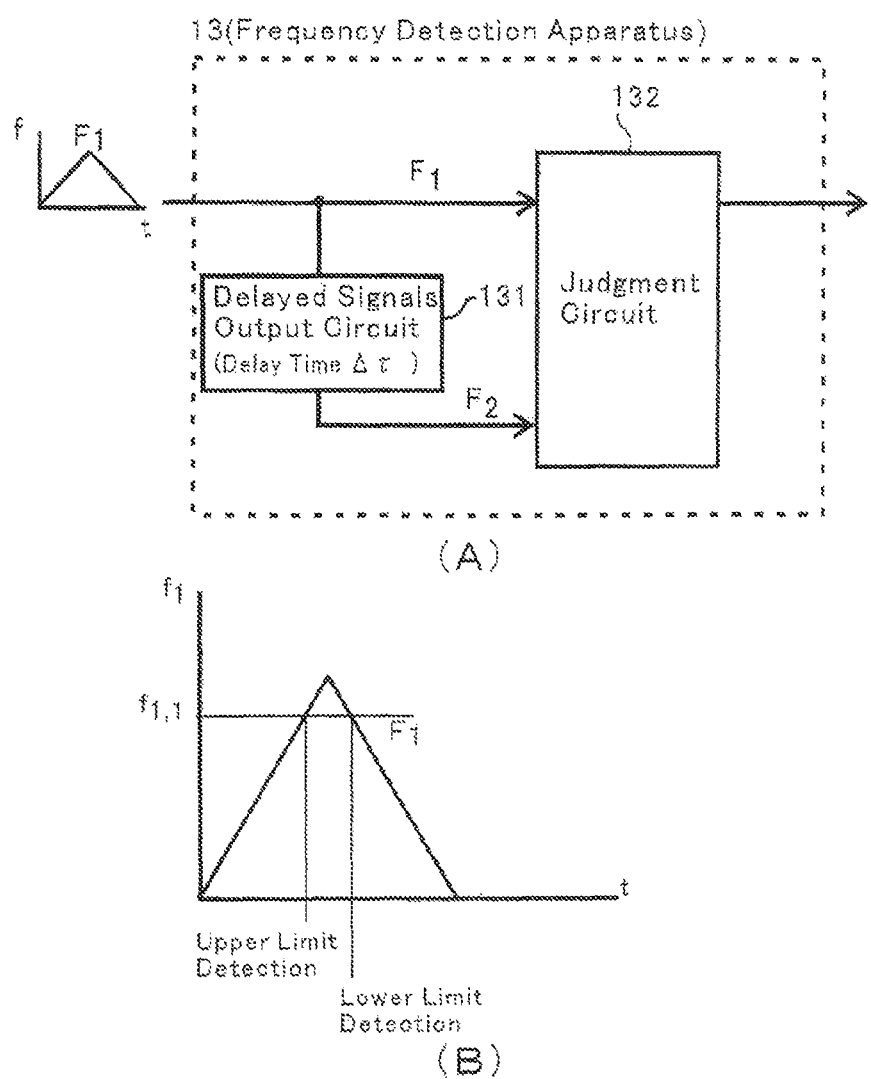
FIG. 3 shows a third embodiment of the present invention, where (A) is a diagram showing configuration of the frequency detection apparatus, (B) is a diagram showing time characteristic of a periodic signal.

FIG. 3 is a diagram showing the third embodiment of the present invention. In FIG. 3(A), a frequency detection apparatus 13 comprises a delayed signals output circuit 131 and a judgment circuit 132. The delayed signals output circuit 131 inputs a periodic signal F1 and outputs a second periodic signal F2 which is delayed to the periodic signal F1 by $\Delta\tau$. The judgment circuit 132 inputs the periodic signal F1 and the second periodic signal F2.

The frequency of the periodic signal F1 increases in proportion to time and decreases in proportion to time as shown in FIG. 3(B).

The periodic signal F1 and the second periodic signal F2 is a string of pulses as shown in FIG. 4. Number (1, 2, 3, ...) is assigned to each pulse of F1 and F2 respectively. The time interval of pulse of the periodic signal F1 and the second periodic signal F2 decreases by a harmonic sequence from the 1st pulse to the 10th pulse.

T1: the time interval between the 1st pulse and the 2nd pulse
T1=1 sec,
T2: the time interval between the 2nd pulse and the 3rd pulse
T2=½ sec,
T3: the time interval between the 3rd pulse and the 4th pulse
T3=⅓ sec,
...
T9: the time interval between the 9th pulse and the 10th pulse
T9=⅑ sec.

The time interval of pulse of the periodic signal F1 and the second periodic signal F2 increases by a harmonic sequence from the 10th pulse.

T10: the time interval between the 10th pulse and the 11th pulse
T10=⅛ sec
T11: the time interval between the 11th pulse and the 12th pulse
T11=1/7 sec
...
The judgment circuit 132 outputs a judgment signal that the periodic signal F1 has reached the upper limit frequency (f1, 1) which is $1/\Delta\tau$ when the 6th pulse and the 7th pulse of the periodic signal F1 are both located between the 5th pulse and the 6th pulse of the second periodic signal F2.

And the judgment circuit 132 outputs a judgment signal that the periodic signal F1 has reached the lower limit frequency (f1, 1) which is $1/\Delta\tau$ when the 11th pulse and the 12th pulse of the second periodic signal F2 are both located between the 12th pulse and the 13th pulse of the periodic signal F1.

The invention claimed is:

1. A frequency detection apparatus of a periodic signal comprising:
    a delayed signals output circuit, and
    a judgment circuit,
    wherein the periodic signal is a string of pulses and the time interval of pulses changes according to time,
    the delayed signals output circuit inputs the periodic signal and outputs a second periodic signal which is delayed to the periodic signal by a predetermined delay time,
    the judgment circuit inputs the periodic signal and the second periodic signal, and outputs a judgement signal,
    in the case when the time interval of pukes decreases according to time, the judgement circuit outputs the judgement signal when two consecutive pulses of the periodic signal are located between two consecutive pulses of the second periodic signal, and
    in the case when the time interval of pulses increases according to time, the judgement circuit outputs the judgement signal when two consecutive pulses of the second periodic signal are located between two consecutive pulses of the periodic signal.

2. The frequency detection apparatus according to claim 1, wherein the delayed signals output circuit inputs the periodic signal and outputs the second periodic signal which is delayed to the periodic signal by $\Delta\tau$,
    in the case when the time interval of pulses decreases according to time, the judgment circuit outputs the judgement signal that the periodic signal has reached the upper limit frequency $1/\Delta\tau$ when two consecutive pulses of the periodic signal are located between two consecutive pulses of the second periodic signal, and
    in the case when the time interval of pulses increases according to time, the judgment circuit outputs the judgement signal that the periodic signal has reached the lower limit frequency $1/\Delta\tau$ when two consecutive pulses of the second periodic signal are located between two consecutive pulses of the periodic signal.

* * * * *